US010481038B2

(12) United States Patent
Seemueller

(10) Patent No.: US 10,481,038 B2
(45) Date of Patent: Nov. 19, 2019

(54) APPARATUS AND METHOD FOR TESTING A CHARGING SOCKET TO SUPPLY ELECTRIC ENERGY TO AN ENERGY RESERVOIR OF A VEHICLE

(71) Applicant: Lisa Draexlmaier GmbH, Vilsbiburg (DE)

(72) Inventor: Markus Seemueller, Gangkofen (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 0 days.

(21) Appl. No.: 16/211,022

(22) Filed: Dec. 5, 2018

(65) Prior Publication Data
US 2019/0170605 A1 Jun. 6, 2019

(30) Foreign Application Priority Data
Dec. 6, 2017 (DE) .................. 10 2017 129 061

(51) Int. Cl.
*G01M 3/28* (2006.01)
*G01R 31/04* (2006.01)
*B60L 53/16* (2019.01)
*G01M 3/22* (2006.01)
*G01M 3/38* (2006.01)
*G01M 3/04* (2006.01)
(Continued)

(52) U.S. Cl.
CPC .......... *G01M 3/2838* (2013.01); *B60L 53/16* (2019.02); *G01R 31/045* (2013.01)

(58) Field of Classification Search
CPC . G01M 3/2838; G01R 31/045; B01L 11/1818
See application file for complete search history.

(56) References Cited

U.S. PATENT DOCUMENTS 8,708,014 B2 * 4/2014 Schibsbye ............. B29C 70/443
156/378
2014/0109655 A1 * 4/2014 Eshima ................ G01M 3/221
73/40.7
(Continued)

FOREIGN PATENT DOCUMENTS

CN 103308261 9/2013
DE 10356039 6/2005
(Continued)

OTHER PUBLICATIONS

English machine translation for document DE 102011116721.*

*Primary Examiner* — Daniel S Larkin
*Assistant Examiner* — Anthony W Megna Fuentes
(74) *Attorney, Agent, or Firm* — Burris Law, PLLC

(57) ABSTRACT

A tightness test device includes a charging socket to supply electric energy to an energy reservoir of a vehicle, which has a test adapter for contacting of a sealed plug connector of a wiring network including the sealed plug connector, a charging socket for mounting to an at least partly electrically powered vehicle and also a cable connecting the plug connector and the charging socket, a fluid supply connected to the test adapter which is set up to provide a fluid to the test adapter, and a measuring device for detection of tightness of the charging socket and/or of the wiring network based on the provided fluid. In addition, a method is described for testing a charging socket to supply electric energy to an energy reservoir of a vehicle.

18 Claims, 4 Drawing Sheets

(51) Int. Cl.
*G01M 3/26* (2006.01)
*G01M 3/32* (2006.01)

(56) References Cited

U.S. PATENT DOCUMENTS

| | | | | |
|---|---|---|---|---|
| 2015/0104961 A1* | 4/2015 | Bito | ............... | B60L 11/1818 |
| | | | | 439/142 |
| 2015/0292975 A1* | 10/2015 | Xu | .................. | G01N 33/004 |
| | | | | 73/40.7 |

FOREIGN PATENT DOCUMENTS

| | | | | |
|---|---|---|---|---|
| DE | 102011116721 A1 * | 4/2013 | ........... | G01R 31/045 |
| DE | 102016100817 | 7/2017 | | |

\* cited by examiner

APPARATUS AND METHOD FOR TESTING A CHARGING SOCKET TO SUPPLY ELECTRIC ENERGY TO AN ENERGY RESERVOIR OF A VEHICLE

CROSS-REFERENCE TO RELATED APPLICATIONS

This application claims priority to and the benefit of DE 10 2017 129 061.3 filed on Dec. 6, 2017. The disclosure of the above application is incorporated herein by reference.

FIELD

The present disclosure relates to an apparatus for testing of a charging socket to supply electric energy to an energy reservoir of a vehicle, and to a method for testing of a charging socket to supply electric energy to an energy reservoir of a vehicle.

BACKGROUND

The statements in this section merely provide background information related to the present disclosure and may not constitute prior art.

The plug-in hybrid vehicles (PHEV) and also purely electric vehicles (BEV) each feature a charging socket through which external electric energy can be supplied to the battery of the motor vehicle. Generally, the electric supply can occur through standard household electric sockets or also from fast charging stations. The charging socket is understood to be in particular a connection point of an at least partially electrically powered motor vehicle, in particular of an electric or hybrid motor vehicle, to which an external charging line can be connected in order to supply electric energy from outside of the motor vehicle to a battery, generally also denoted as an energy reservoir, of the motor vehicle.

A charging socket of this kind features a moisture-tight space surrounded by a wall, in which electric contacts and an electronic controller can be provided. A moisture-tight space of this kind can also be provided on other electric or electronic devices, for example in an electronic device of an industrial facility or such, located on a support rail, wherein within one such moisture-tight space, electric or electronic components, for example switching systems, can be arranged on a circuit board or similar item.

A charging socket of this kind is part of a wiring network which comprises one or a plurality of sealed plug connectors which are connected via a cable to the charging socket. In this regard it is important that no moisture can penetrate into the moisture-tight space, either via a connection for a charging connector or charging bushing to the charging socket, nor via the connected cable. This has to be tested at the end of the production.

In this regard, charging sockets are known which additionally feature an access point to the moisture-tight space for a pressure test. A system of this kind is disclosed for example, in the patent disclosure DE 10 2016 100 817 A1. The disadvantage therein is that the additional access point can also be an additional failure point for leakage.

CN 103 308 261 A describes an online test system for high voltage wiring harness seals for vehicles which comprises a fast detection apparatus and an air-tight leak detector. The system can effectively detect the leakage rate of the high voltage wiring harness.

DE 103 56 039 A1 pertains to a blowing device for testing of a cable sleeve for tightness, which can be arranged in an unused cable lead opening of the cable sleeve, a cable sleeve with a blowing apparatus arranged in an unused cable lead opening and a method for testing of cable sleeves ready for laying, for their tightness in particular against fluids.

SUMMARY

Generally, the present disclosure provides a test system and a test method which uses simple design means for testing of the tightness of a wiring network without making any changes to the network.

Refinements of the present disclosure are stated in the dependent claims, in the description and in the accompanying figures. In particular, the independent claims of a claim category can also be modified analogous to the dependent claims of a different claim category.

A tightness test apparatus for a charging socket of a wiring network according to the present disclosure comprises a test adapter, a fluid supply, and a measuring device. A test adapter is set up to contact a sealed plug connector of the wiring network. The wiring network in this case comprises the sealed plug connector, the charging socket for mounting to an at least partly electrically powered vehicle, and also a cable which connects the charging socket to the sealed plug connector. The cable can also be understood to be simply a line. The cable features at least one electric conductor and also an insulator surrounding the at least one electrical conductor. In the case of a cable with a plurality of electrical conductors, each conductor can feature an insulation and the plurality of electrical conductors can be surrounded by a common insulation or protective casing. The fluid supply is connected to the test adapter and is set up so as to provide a fluid to the test adapter, whereby the fluid is guided via the sealed plug connector into the wiring network. The measuring device is set up to detect the tightness of the charging socket and in addition or alternatively, to detect the tightness of the wiring network based on the provided fluid.

A method according to the present disclosure for testing of a charging socket to supply electric energy to an energy reservoir of a vehicle comprises the steps of contacting, of provision, of guiding and also of detecting. In the contacting step, a sealed plug connector of a wiring network is contacted. The wiring network comprises the sealed plug connector, the charging socket and also a cable connecting the plug connector and the charging socket. In the step of provision, a fluid is provided to the sealed plug connector. In the step of guiding, the provided fluid is guided from the sealed plug connector via the cable to the charging socket. In the step of detecting, the tightness of the charging socket and simultaneously or alternatively, the tightness of the wiring network is detected based on the provided fluid.

In other words, compressed air or another gaseous substance is injected via the plug connector and flows through the cable into the charging socket. Any potential leakage can be measured by means of the measuring device. During the pressure build-up phase, a high rate of flow exists. If all components and the connection of the components to the wiring network are tight, then the flow value after the pressure build-up phase fluctuates to a value near 0 ml/min, or alternatively to a basic leakage value within a tolerance range. The cable between the plug connector and the charging socket herein is used quasi as a compressed air line or a fluid line, respectively, for the tightness test of the component or components installed thereafter.

In one form, the wiring network pertains to a high voltage wiring network. Thus, the plug connector pertains to a high voltage plug connector in which the charging socket pertains to a high voltage charging socket and the connecting cable pertains to the high voltage cable. In this case the test adapter is set up to contact the high voltage plug connector. The contact between the test adapter and the plug connector is designed to be fluid-tight.

The wiring network can comprise a plurality of sealed plug connectors which are each connected to the charging socket by at least one cable. Thus, a sealed plug connector with two or more cables can be connected to the charging socket, for example to conduct alternating current and/or a multi-phase current from the charging socket to the plug connector or vice-versa. The test adapter herein can be set up to contact the majority of the sealed plug connectors. The fluid supplied via the test adapter can be guided through the plurality of plug connectors into the wiring network. Thus, in an advantageous manner a more complex structure of the wiring network can also be tested.

The fluid can be supplied at an over-pressure in comparison to the ambient pressure and injected into the wiring network. Thus, the fluid can be provided at a pressure which corresponds to at least 1.05-times or 1.07-times the value of the ambient pressure. For example, the over-pressure can correspond to about 0.7 bar or 1 psi. Thus, the fluid can be provided at a pressure which corresponds to at least 1.1-times the value of the ambient pressure. Furthermore, the fluid can be provided at a pressure which corresponds to at least 1.2-times or more, of the value of the ambient pressure. In other words, the fluid can be provided at a pressure that is 10% greater, in particular 20% greater, than the ambient pressure.

The tightness test apparatus can comprise a flow sensor. Thus, the flow sensor can be part of the measuring apparatus. The flow sensor can measure and monitor a flow quantity of the provided fluid. In this regard the flow quantity can be compared to a predefined threshold value. The progression of the flow quantity with regard to time can be adjusted to a constant value after a settling time. By means of a comparison to a threshold value, a statement about the tightness can be easily made. In an improved system, the flow quantity can settle to a value of about 0 ml/min after the settling time, provided the wiring network and in particular the charging socket are tight. Thus an "in-order" message can be output. If the flow quantity after the settling time settles to a value greater than a predefined threshold value of 100 ml/min or 300 ml/min or 600 ml/min, for example, then a conclusion of leakage or absent tightness is justified.

In one particular variation, a gaseous fluid can be provided. For example, the fluid can be air. In particular, the fluid can be helium or hydrogen, or the fluid can feature an increased percentage of helium or hydrogen in comparison to normal air. For example, the exit of helium or hydrogen can be detected with a gas sensor and thus a leakage can be diagnosed.

In another variation, the fluid can be colored or have a refractive index different from air, or alternatively have a temperature different from the ambient air, and the color difference, the difference in refractive index or the temperature difference can be selected as accordingly high, so that due to the measuring apparatus, a change in the environment of the wiring network can be detected due to the leakage. Thus, the measuring device can feature a sensor adapted to this circumstance. This can thus pertain to an optical measurement technology or to an optical sensor, such as a camera for example.

The tightness-test apparatus can additionally feature test means for an electrical test of the wiring network. For example, the test adapter can comprise high voltage contact elements for electrical contacting and testing of the wiring network. In a variant of this kind, the measuring device can additionally feature electrical measurement means in order firstly to apply a test voltage and alternatively or additionally, a test current to the wiring network and to evaluate the measurement accordingly.

The idea presented creates a possibility for a complete testing of the tightness of a high voltage network all at once, including in particular the cable insulation.

The present disclosure will be described below primarily in connection with a high voltage wiring network for motor vehicles. However, the present disclosure can be used in any application in which electric wiring networks are to be tested for tightness and the electric lines can be used as compressed air lines.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
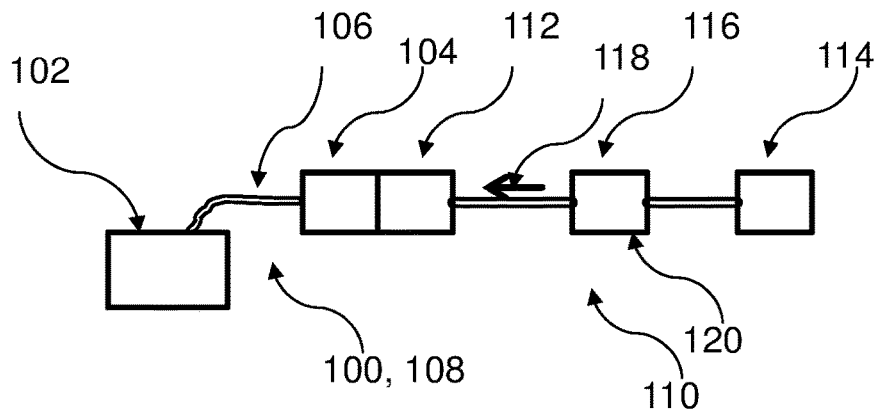
FIG. 1 is a schematic depiction of a tightness test device arranged on a wiring network with a charging socket according to a first exemplary form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a wiring network 100 with a charging socket 102, a sealed plug connector 104 and also a cable 106 connecting the charging socket 102 and the sealed plug connector 104. The charging socket 102 is set up so as to supply electric energy to an energy reservoir (not depicted) of a motor vehicle. According to the specification, the cable 106 is fluid-tight and connected to the fluid-tight charging socket 102. Likewise, according to the specification, the cable 106 is connected fluid-tight to the sealed plug connector 104. The wiring network 100 pertains to a test specimen 108 whose tightness is to be verified. Furthermore, a tightness testing device 110 is connected to the plug connector 104 of the wiring network 100. The tightness testing device 110 comprises a test adapter 112, a fluid supply 114 and also a measuring device 116. The test adapter 112 contacts the plug connector 104. Thus, a fluid-tight connection is established between the two elements. The fluid supply 114 is set up so as to provide a fluid 118 to the test adapter 112. In the illustrated exemplary form, the measuring device 116 is located between the fluid supply 114 and the test adapter 112. The fluid 118 provided by the fluid supply 114 is guided via the measuring device 116 to the test adapter 112. The measuring device 116 is set up so as to determine the tightness of the charging socket 102 based on an evaluation of the physical parameters of the provided fluid 118.

In one aspect, the wiring network 100 pertains to a high voltage wiring network. Thus, the cables 106 can feature a silicone insulation.

The tightness testing device 110 is set up to test the test specimen 108 for leaks. In the simplified representation of FIG. 1, the charging socket 102 is depicted only schematically. The charging socket 102 has a sealed space on the back side, in which the contacts and a circuit board are located. There is no direct possibility to supply compressed air to the sealed region of the charging socket in order to conduct the test. In the illustrated variation, the charging socket 102 does not feature any "injection point," through which the compressed air could be injected in order thus to test for leakage or tightness. An injection point of this kind also represents an additional source of potential failure, since this unit can itself become untight, in particular after a test run. Thus, a conventional pressure test across the contact side of the charging socket 102 is not able to provide or to test dependably the overall tightness of the charging socket 102, since seals installed on the back side would not be tested.

In one variant the measuring device 116 comprises a flow sensor 120. The flow sensor 120 is set up to detect a flow quantity of the fluid 118. In addition, the measuring device 116 is set up to determine the tightness when using the flow quantity. After a pressure build-up phase at a high rate of flow, the flow value will settle down to one value. The time duration of the pressure build-up phase is also called the settling time. If this value is below a predefined threshold value, then the test specimen 108 is designated as tight or "in order."

Figure 2:
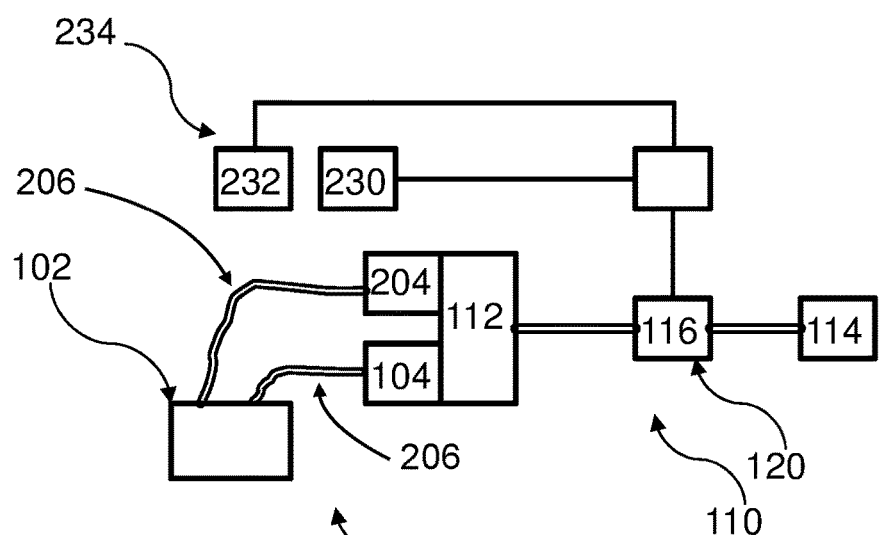
FIG. 2 is a schematic depiction of a tightness test device arranged on a wiring network with a charging socket according to a second exemplary form of the present disclosure.

FIG. 2 shows a second, expanded variation of a tightness test device 110, in comparison to the first form depicted in FIG. 1. The wiring network 100 features a second plug connector 204. The second plug connector 204 is connected to the charging socket 102 by means of two cables 206. The test adapter 112 is designed so as to make a fluid-tight contact with both the first plug connector 104 and also the second plug connector 204. The concept is scalable. In a first form, the test adapter 112 is designed to contact all plug connectors 104, 204 of a wiring network 100. In a second variant, the test adapter 112 is designed to contact at least one first plug connector 104; the remaining plug connectors 204 of the wiring network 100 are sealed fluid-tight with caps (not illustrated).

In one variant, the fluid 118 is a gaseous material. Thus, the fluid can be air; in one special variant, the fluid has an elevated percentage of helium or hydrogen, which can be detected with a gas sensor 230. For example, the gas sensor 230 is set up to sense an emission of the fluid containing helium or hydrogen from the charging socket 102 and/or from the wiring network 100 and to indicate a leakage accordingly. An indicated leakage is not in compliance with the requirement for tightness. In this case, the test specimen 108 will be sorted out.

In the second exemplary variation depicted in FIG. 2, the measuring device 116 comprises a visual sensor 232 in addition to the gas sensor 230. The visual sensor 232 can pertain to a camera 234, in particular for detection of color images. It is even possible to dye the employed fluid 118 and thus any leakage or absence of tightness of the test specimen 108 will be detected when a correspondingly colored fluid emerges. In such a case the evaluation of color information (possibly even based purely statistically on a histogram) is sufficient to test for tightness.

Figure 3:
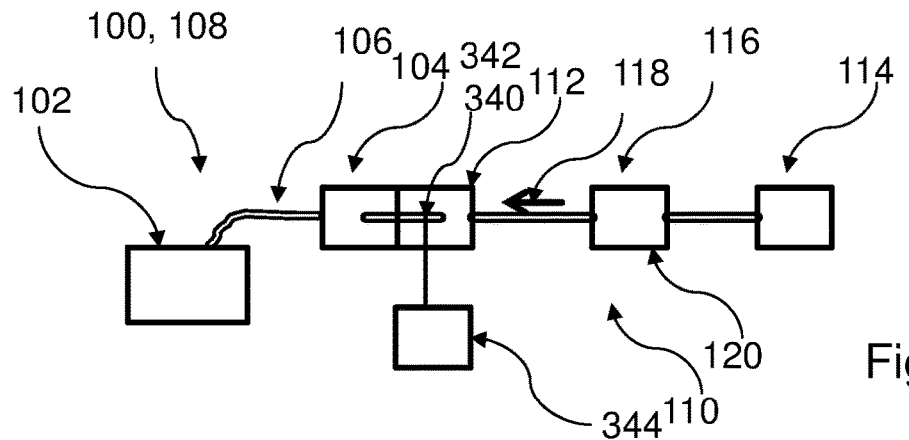
FIG. 3 is a schematic depiction of a tightness test device arranged on a wiring network with a charging socket according to a third exemplary form of the present disclosure.

FIG. 3 expands the exemplary variations already described with additional contact elements 340 for electrical contacting of the wiring network 100. If the wiring network 100 pertains to a high voltage wiring network, then the contact elements 340 can also be designed as high voltage contact elements 342. In this case, the tightness test device 100 can be expanded by an additional electric test device 344 which is set up to test the specimen 108 electrically, in parallel with the leakage test.

Figure 4:
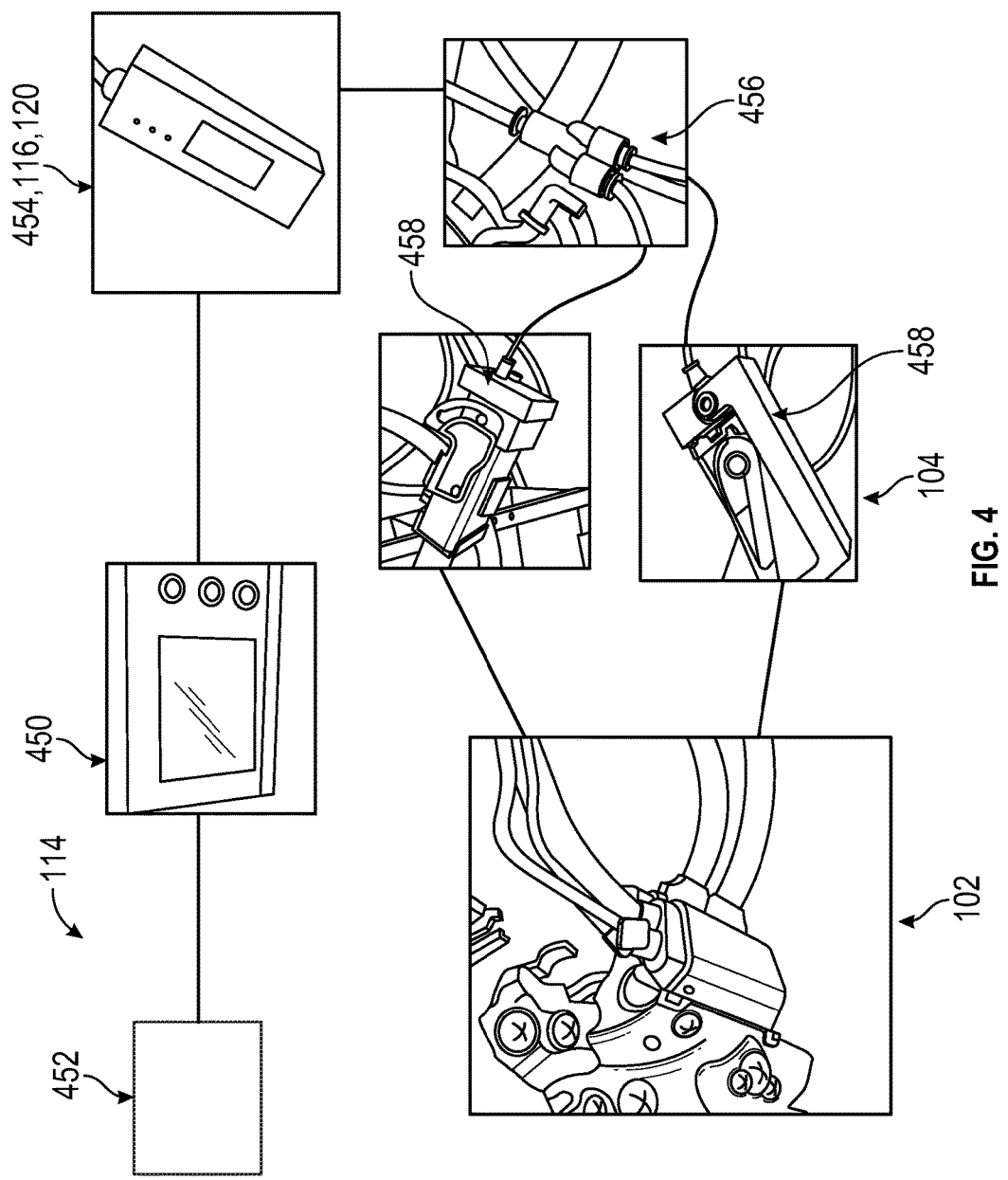
FIG. 4 is a simplified depiction of a tightness test device arranged on a wiring network with a charging socket according to a fourth exemplary form of the present disclosure.

The entire wiring network 100, also denoted as the charging line set, forms an air-tight network. The charging socket 102 cannot be supplied with air directly in order to measure the tightness. The concept described here provides that the entire wiring network is subjected to a leakage test. The plug connectors 104, 204 are used as interfaces to the test system, that is, to the tightness test device 110. The measuring device is set up, for example as depicted in the exemplary variation in FIG. 4, in order to draw a conclusion about the tightness of the system from a determination of the flow value in l/min at an over-pressure of 0.2 bar. In the variant in FIG. 4, the fluid 118 is injected via a compressed air control unit 450. The fluid 118 here is provided as compressed air from a central compressed air supply 452. Alternatively, a standard commercial pressure control valve can be used. There is a flow meter 454 which determines the flow-through and thus the leakage; this flow meter is located between the injected pressure, that is, the compressed air supply 452 and compressed air control unit 450 or alternatively, pressure control valve, and the plug connectors 104, 204, designed here as high voltage plug. Thus, the flow meter 454 represents a measuring device 116 comprising a flow sensor 120.

After the flow meter 454, the fluid 118 is guided via a T-distributor 456 to two separate contact bushings 458. The T-distributor 456 and the two separate contact bushings 458 are part of the test adapter 112. The contact bushings 458 are set up to contact the plug connectors 104, 204 in a fluid-tight manner. In other words, the contact bushings 458 are installed in the test adapter 112 for sealing. The contact bushings 458, also designated as the installed part, have a geometry of the region of their sealing surface which corresponds to the installed parts of test adapters 112 and/or corresponding counter-plugs. The compressed air and/or the fluid 118 is applied to the plug connectors 104, 204 via the contact bushings 458. The fluid 118 injected in this manner is guided via the cables 106, 206, which are designed as high voltage lines in the depicted exemplary variation, into the charging socket 102.

The flow meter 454 features a measurement range from 0 ml/min up to 999 ml/min. An additional PE line can be provided, for example, to the charging socket 102, through which a small quantity of the fluid 118 can escape. In such a case, the flow quantity can fluctuate and then settle, for example, to a value of 30 ml/min. In such a case, one could define the threshold value as 35 ml/min and any values greater than the threshold value would mean an unwanted leakage is detected. In an alternative wiring network 100, the threshold value can be established, for example, at 100 ml/min at an over-pressure of 0.2 bar.

Tests have shown that at 0.2 bar over-pressure, within less than 1 minute a sufficient volume of air can be injected such that a corresponding counter-pressure has built up in the charging socket 102 and/or in the wiring network 100, respectively. In this case the settling time would be defined as 1 minute.

Figure 5:
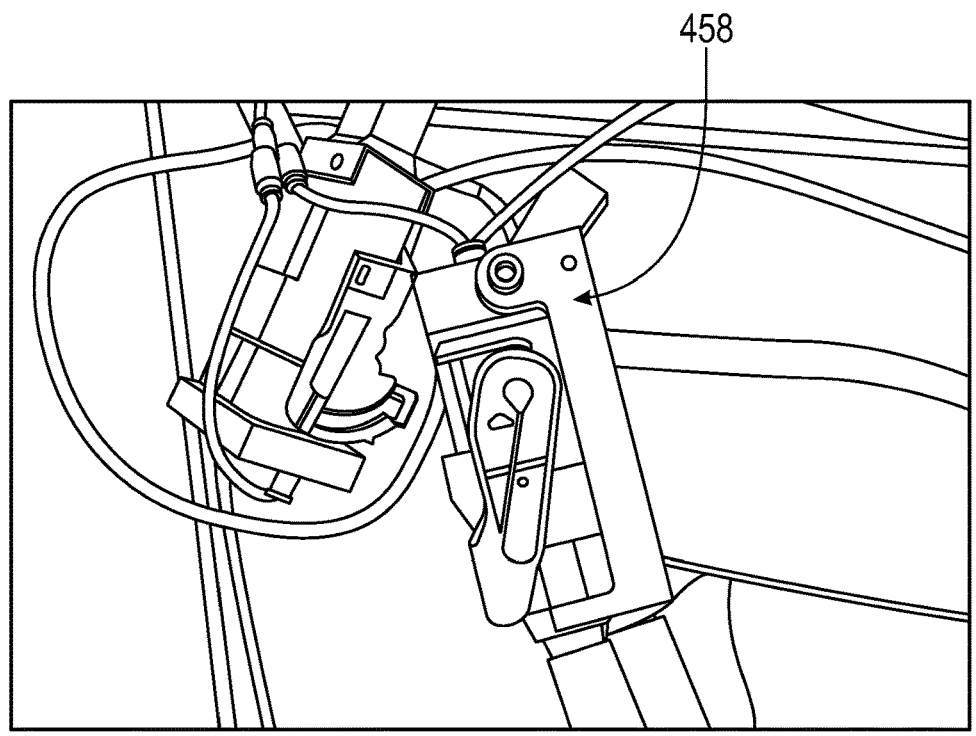
FIG. 5 is a test adapter on a sealed plug connector according to one exemplary form of the present disclosure.
Figure 6:
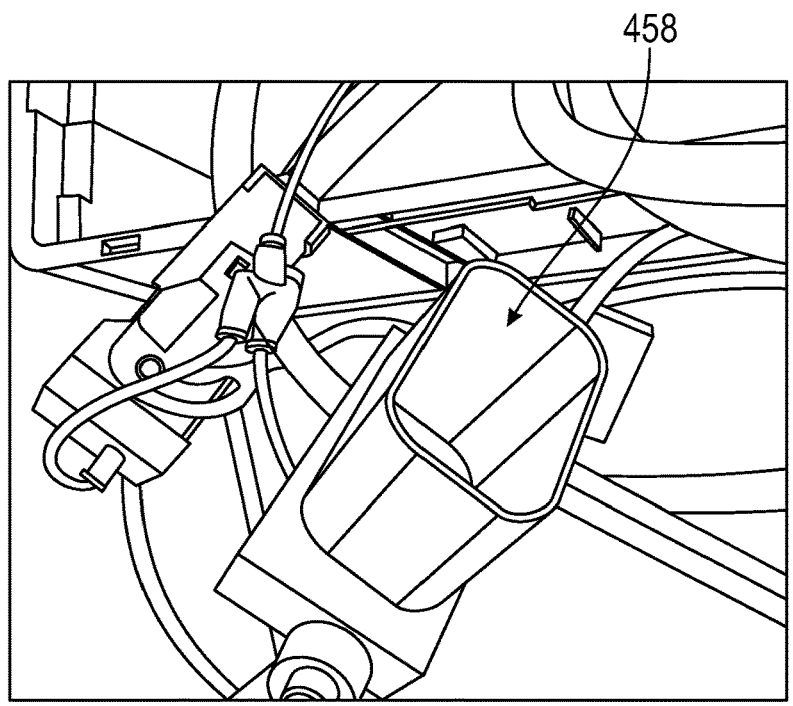
FIG. 6 is a test adapter on a sealed plug connector according to an additional exemplary form of the present disclosure.

FIGS. 5 and 6 depict variants of contact bushings 458 as part of a test adapter 112. The geometry of the contact bushings 458 correspond to counter-plugs of the plug connectors 104, 204, and establish a fluid-tight connection between the test adapter 112 and the plug connectors 104, 204, so that the fluid 118 can be directed into the wiring network 100.

Figure 7:
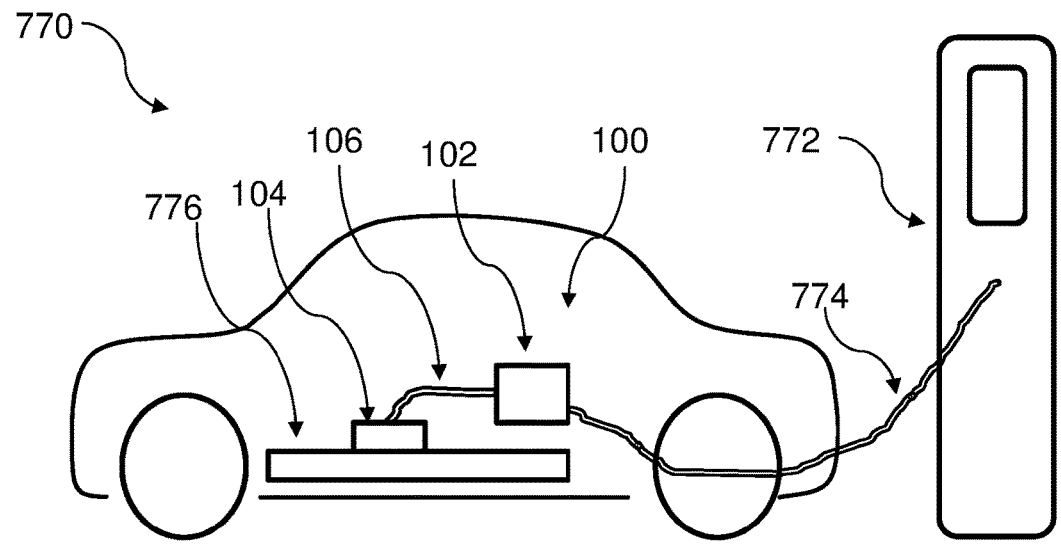
FIG. 7 is a schematic depiction of a vehicle with a charging socket and a wiring network comprising the charging socket.

FIG. 7 depicts a vehicle 770 with a charging socket 102 at a charging station 772. The charging station 772 is connected via a charging cable 774 to the charging socket 102 of the vehicle 770. For this purpose, the charging cable 774 features at its end distant from the charging station 772, a charging plug (not illustrated) for contacting of the charging socket 102. The charging socket 102 is a part of a wiring network 102, as is described in FIGS. 1 to 3, for example. A plug connector 104 is connected to an energy reservoir 776 of the vehicle 770. Thus FIG. 7 depicts a schematic view of a charging system, such as is used for charging of an electrically powered vehicle, briefly denoted as an electric vehicle or BEV or PHEV.

The charging socket 102 can also be designated as a charging bushing and a counter-plug in the form of a charging plug electrically connected to the charging station 772 can be inserted at the end of the charging cable 774. The charging cable 774 is electrically connected to the charging station, so that due to a connection between charging socket 102 and the charging plug (not illustrated), an electric connection can be established between the charging station 772 and the vehicle 770, and charge currents can be transferred for charging of the energy reservoir 776 of the vehicle 770.

Figure 8:
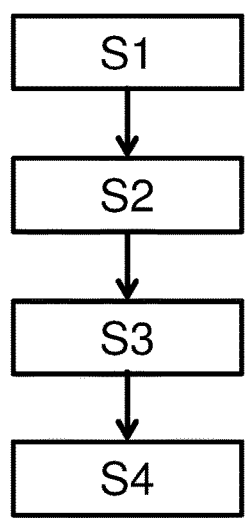
FIG. 8 is a flowchart of a method for testing of a charging socket to supply electric energy to an energy reservoir of a vehicle according to one exemplary form of the present disclosure.

FIG. 8 depicts a flow chart of a method according to the present disclosure for testing of a charging socket to supply electric energy to an energy reservoir of a vehicle, with the steps of contacting S1, provision S2, guiding S3 and also detecting S4.

At step S1 for contacting, a sealed plug connector of a wiring network comprising the sealed plug connector, a charging socket for mounting to an at least partly electrically powered vehicle and also a cable connecting the plug connector and the charging socket, are contacted. At step S2, a fluid is provided to the plug connector which at step S3 of guiding, is directed from the plug connector via the cable to the charging socket. At step S4 of detecting, the tightness of the charging socket or the tightness of the wiring network is detected based on the provided fluid.

Since the apparatus and method described in detail above pertain to design examples, they can be modified in the usual manner by the skilled person within broad limits, without leaving the scope of the present disclosure. In particular, the mechanical arrangements and the size relationships of the individual elements to each other are provided merely as examples.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The description of the disclosure is merely exemplary in nature and, thus, variations that do not depart from the substance of the disclosure are intended to be within the scope of the disclosure. Such variations are not to be regarded as a departure from the spirit and scope of the disclosure.

As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A tightness test device for a charging socket to supply electric energy to an energy reservoir of a vehicle, the tightness test device comprising: a test adapter for contacting a first sealed plug connector of a wiring network comprising the sealed plug connector, a charging socket for mounting to an at least partially electrically powered vehicle, and a first cable connecting the first sealed plug connector and the charging socket, wherein the cable includes at least one electrical conductor and an insulator surrounding the at least one electrical conductor, and the test adapter contacts a second sealed plug connector that is connected to the charging socket via a second cable; a fluid supply connected to the test adapter to provide a fluid to the test adapter; and a measuring device for detecting a tightness of the charging socket and/or of the wiring network based on the fluid provided by the fluid supply.

2. The tightness test device according to claim 1, wherein the wiring network is a voltage wiring network and the test adapter contacts the first sealed plug connector.

3. The tightness test device according to claim 1, in which the fluid supply is set up to provide the fluid at least at a pressure of 1.05-times ambient pressure.

4. The tightness test device according to claim 1, in which the fluid supply is set up to provide the fluid at least at a pressure of 1.1-times ambient pressure.

5. The tightness test device according to claim 1, in which the fluid supply is set up to provide the fluid at least at a pressure of 1.2-times ambient pressure.

6. The tightness test device according to claim 1, in which the measuring device comprises a flow sensor and monitors a flow quantity and/or a pressure of the fluid provided by the fluid supply to determine the tightness.

7. The tightness test device according to claim 6, in which the measuring device compares the flow quantity to a threshold value, wherein the tightness is detected when the flow quantity is less than the threshold value.

8. The tightness test device according to claim 6, in which the measuring device compares the flow quantity to a threshold value, wherein the tightness is detected when the flow quantity is less than the threshold value after a settling time.

9. The tightness test device according to claim 1, in which the fluid is a gas.

10. The tightness test device according to claim 9, in which the measuring device comprises a gas sensor to detect an emission indicating a leakage.

11. The tightness test device according to claim 1, in which the fluid is selected from the group consisting of helium, hydrogen, and air.

12. The tightness test device according to claim 1, in which the measuring device comprises a visual sensor to detect an emission indicating a leakage.

13. A method for testing a charging socket to supply electric energy to an energy reservoir of a vehicle comprising: contacting a first sealed plug connector of a wiring network comprising the first sealed plug connector with a test adapter, a charging socket for mounting to an at least partially electrically powered vehicle, and a first cable connecting the first sealed plug connector and the charging socket, wherein the first cable includes at least one electrical conductor and an insulator surrounding the at least one electrical conductor and the test adapter contacts a second sealed plug connector that is connected to the charging socket via a second cable; providing a fluid to the first sealed plug connector; guiding the fluid from the first sealed plug connector via the first cable to the charging socket; and detecting a tightness of the charging socket and/or of the wiring network based on the fluid.

14. The method according to claim 13, in which, at the providing the fluid, the fluid is provided at least at a value of 1.07-times the ambient pressure.

15. The method according to claim 13, in which, at the providing the fluid, the fluid is provided at least at a value of 1.2-times the ambient pressure.

16. The method according to claim 13, in which, at the detecting the tightness, a flow quantity and/or a pressure of the fluid is monitored and the tightness is determined by the flow quantity and/or the pressure.

17. The method according to claim 16, in which, at the detecting the tightness, the flow quantity is compared to a threshold value, wherein a positive tightness information is provided when the flow quantity is less than the threshold value.

18. The method according to claim 16, in which the detecting is performed after a settling time.

* * * * *